(12) United States Patent
Symons

(10) Patent No.: US 7,162,887 B2
(45) Date of Patent: Jan. 16, 2007

(54) INTEGRATED LIQUID COOLING DEVICE FOR ELECTRONIC COMPONENTS

(76) Inventor: Robert S. Symons, 290 Surrey Pl., Los Altos, CA (US) 94022

( * ) Notice: Subject to any disclaimer, the term of this patent is extended or adjusted under 35 U.S.C. 154(b) by 200 days.

(21) Appl. No.: 10/888,101

(22) Filed: Jul. 9, 2004

(65) Prior Publication Data

US 2006/0007655 A1    Jan. 12, 2006

(51) Int. Cl.
F25D 23/12  (2006.01)
(52) U.S. Cl. .......................................... 62/259.2; 62/3.6
(58) Field of Classification Search ............... 62/259.2, 62/3.2, 3.3, 3.6; 361/699
See application file for complete search history.

(56) References Cited

U.S. PATENT DOCUMENTS

| | | | |
|---|---|---|---|
| 4,519,447 A | 5/1985 | Wiech |
| 4,619,316 A | 10/1986 | Nakayama |
| 4,790,370 A | 12/1988 | Niggemann |
| 4,880,049 A | 11/1989 | Jaeger |
| 4,986,346 A | 1/1991 | Blackmon |
| 5,001,548 A | 3/1991 | Iversen |
| 5,004,041 A | 4/1991 | Jaeger |
| 5,035,588 A | 7/1991 | Tuckey |
| 5,062,471 A | 11/1991 | Jaeger |
| 5,092,241 A | 3/1992 | Feser |
| 5,096,390 A | 3/1992 | Sevrain |
| 5,131,233 A | 7/1992 | Cray |
| 5,183,104 A | 2/1993 | Novotny |
| 5,203,399 A | 4/1993 | Koizumi |
| 5,265,997 A | 11/1993 | Tuckey |
| 5,316,077 A | 5/1994 | Reichard |
| 5,349,831 A | 9/1994 | Daikoku |
| 5,394,936 A | 3/1995 | Budelman |
| 5,417,077 A | 5/1995 | Jeffery |
| 5,504,294 A | 4/1996 | Izumiya |
| 5,562,089 A | 10/1996 | Astle |
| 5,731,954 A | 3/1998 | Cheon |
| 5,810,568 A | 9/1998 | Whitefield |
| 5,823,249 A | 10/1998 | Batchelder |
| 5,860,472 A | 1/1999 | Batchelder |
| 5,884,691 A | 3/1999 | Batchelder |
| 5,943,211 A | 8/1999 | Havey |
| 5,961,293 A | 10/1999 | Clemmons |
| 5,997,261 A | 12/1999 | Kershaw |

(Continued)

*Primary Examiner*—Melvin Jones
(74) *Attorney, Agent, or Firm*—O'Melveny & Myers LLP

(57) ABSTRACT

An integrated liquid cooling device for electronic components addresses the need for efficient cooling created by ever increasing power densities of electronic components. The integrated liquid cooling device has a housing thermally connected to the electronic component, cooling liquid contained in the housing, a motor immersed in the cooling liquid and mounted to the housing, an impeller driven by the motor, and cooling surfaces on the exterior of the housing. The motor driven impeller creates a turbulent flow in the cooling liquid, which rapidly transfers heat from the electronic component and distributes it throughout the interior of the housing. The cooling surfaces on the exterior of the housing dissipate this heat, either by free or forced convection, into the surrounding environment. Alternately, the integrated liquid cooling device may distribute this heat energy over an equipment case by circulating cooling liquid through a baffled enclosure that provides high velocity cooling liquid flow near the heat generating electronic component. Additional cooling capacity can be gained with the described integrated liquid cooling device by selecting a cooling liquid whose boiling point is near the operating temperature of the electronic component.

26 Claims, 2 Drawing Sheets

U.S. PATENT DOCUMENTS

| | | |
|---|---|---|
| 6,019,165 A | 2/2000 | Batchelder |
| 6,021,844 A | 2/2000 | Batchelder |
| 6,050,326 A | 4/2000 | Evans |
| 6,175,495 B1 | 1/2001 | Batchelder |
| 6,349,760 B1 | 2/2002 | Budelman |
| 6,447,270 B1 | 9/2002 | Schmidt |

INTEGRATED LIQUID COOLING DEVICE FOR ELECTRONIC COMPONENTS

BACKGROUND OF THE INVENTION

1. Field of the Invention

The present invention relates to an apparatus and method for cooling electronic components, and more particularly, to cool electronic components with an integrated cooling device.

2. Description of Related Art

Machines and devices that change energy from one form (chemical, mechanical, thermal, or electrical) to another are rarely 100% efficient. Likewise, devices that change or modulate electrical energy in one form to electrical energy in another form are rarely 100% efficient. For example, a transistor, integrated circuit or a microprocessor may change direct current into alternating current or into pulses on many outputs that signify numerical data. Where direct current is changed into alternating current, only part of the direct current input power is changed into alternating current. The remainder of the input power appears as heat. Where direct current is changed into pulses signifying numerical data, all of the direct current input power becomes heat, and the output is information, not energy.

In many cases, the waste heat generated in a small machine or device is quite large, and the machine can neither radiate nor dissipate the heat to its surroundings, at a reasonable temperature, without providing an additional cooling mechanism. Semiconductors used in computers or as radio-frequency amplifiers are usually not very powerful, nor large, and do not generate a large amount of heat, but they may operate at a very high power density. The trend toward miniaturization and higher frequency operation of electronic devices, achieved through increased packing densities of gates in semiconductor devices, has resulted in ever increasing power densities. Predictions of powers of as much as 200 Watts over an area of two square centimeters (100 Watts per square centimeter) are being made. Such power densities are much too high for direct cooling with air.

There have been various attempts to address cooling issues associated with the increasing power densities of modern electronics. However, each of these attempted solutions has undesirable characteristics. A fairly basic approach to cooling electronic components is by free or forced convection of air over a "heat sink." Typically a heat sink will include an array of cooling fins that collectively have a larger surface area than the electronic component to be cooled. These fins are attached to a thermally conductive base (or heat spreader). Heat from the electronic component is conducted through the conductive base to the roots of the cooling fins and along the fins toward their surfaces. The heat is then transferred from the cooling fins to the surrounding atmosphere via either free or forced convection.

The rate of heat transfer that can be accomplished by a heat sink is quite limited, however. The amount of power (the rate of heat flow) that can be transferred from the fins to the ambient air is a function of the average temperature difference between the fins and the air, the air velocity, and is proportional to the total fin area. For heat to spread radially outward to a large region, to which fins are attached, there must be a long heat path and a large temperature difference between the heated surface and the cool surface. (That is, in the case of a cooled electrical component, between the component itself at the contact point with the heat sink and the surfaces of the cooling fins). The total amount of heat transfer is proportional to the temperature difference between these two surfaces. At some power level, the device will become too hot to operate properly or perhaps even survive. This difficulty in effectively cooling electronic components is aggravated by the increased heat created by the increasing power densities encountered in modern electronic components.

In prior art, a solution to the problem of the large temperature difference in the "spreader" portion of a heat sink and the "fin" portion when used to cool high power-density components has been the replacement of the "heat spreader" with a "heat pipe." In a "heat pipe," the heat generated by a device evaporates a liquid. The vapor rises (perhaps through the central one of two coaxial pipes) and condenses on a cool area (perhaps the outer one of the coaxial pipes which passes through attached air-cooled fins). The liquid then returns to the heat-generating device so the process can repeat. Here, the heat transferred depends upon the mass flow rate of the liquid multiplied by the heat of vaporization of the liquid. Heat pipes with large ratios of cooled fin area to heated area can be made without using a large difference in temperature between the evaporation temperature (the device temperature) and the condensation (fin) temperature. Limitations on heat pipes include the onset of film boiling on the heated surface (which insulates the surface, often followed by rapid temperature rise and failure), pressure build-up which inhibits boiling within the heat pipe, and the requirement that the heat pipe be properly oriented with respect to gravity.

In order to make still larger reductions in the temperature of a cooled device with respect to ambient temperature, it is necessary to use forced convection of heat in solid or liquid material between the device and its surroundings.

Some approaches to cooling heat-generating devices make use of moving solid structures to transport heat from one location to another. Such an approach can be more easily visualized as the heat transfer provided by a reciprocating piston in an internal combustion engine. A piston in an internal combustion engine is heated by the combustion of fuel during the combustion stroke of an Otto cycle engine and the piston then distributes this heat along the stroke depth of the cylinder walls as it travels.

The concept of using a moving part to transfer heat has been applied to the cooling of electronic components. Some devices using this transfer mechanism have used thermally conductive reciprocating sheets or rotating disks in thermal contact with a heat-generating component of a relatively smaller surface area. In these devices, heat is transferred from the heat-generating component to the moving part. Typically the movement of the part distributes the heat relatively evenly over the larger surface area of the moving part. Heat is then dissipated from the moving part through convective cooling (typically, with cooling fins).

Nevertheless, the use of a moving part to remove heat from an electronic component, as provided by the prior art, has several shortcomings. First, in some of the prior-art moving-part cooling devices, the moving part is in direct contact with the heat-generating device. This direct contact leads to friction heating and wear of both the moving part and the heat-generating component. If, as in other prior-art devices, a fluid is used to provide a lubricating interface between the heat-generating component and the moving part, heat must be transferred between the heat-generating component, the relatively poorly conductive lubricating fluid, and into the moving part. In some prior-art moving-part-based cooling devices, the heat would then be transferred through another poorly-conductive-fluid interface to cooling fins. Therefore, the heat transfer path provided by a moving-part-based cooling device is impeded as it passes through several interfaces with low thermal conductivity.

There is another reason that the use of a moving solid part to transfer heat is inferior as compared to simple liquid cooling. The solid moving part used to transfer heat is often a thermally conductive material such as a metal. The thermal capacity of a metal (i.e., the specific heat multiplied by density and temperature rise, or the amount of energy that may be carried by a given volume of the material) is often less than that of a liquid such as water or many other liquids with similar properties. Therefore, the use of a liquid as a heat transfer medium is preferable to a solid moving part because additional heat may be carried by an equal volume of liquid. While still liquids and liquids in laminar flow tend to have lower thermal conductivities (which limit the liquid's ability to rapidly distribute heat energy) than thermally conductive materials such as metals, a liquid in the turbulent flow regime will have similar heat distributing abilities.

An additional advantage of liquid cooling over solid moving-part-based cooling is that the cooling effect provided by a liquid cooling medium can be significantly enhanced through the use of nucleate boiling. Nucleate boiling occurs in liquid cooling devices with high-velocity cooling streams when the temperature of the heat-generating component is slightly higher than the boiling temperature of the cooling liquid. In nucleate boiling, very small bubbles of cooling liquid vapor are swept off of the interface between the heat generating component and the cooling liquid by the flowing liquid. These bubbles then condense within the cooling liquid stream. Through the nucleate boiling mechanism, the heat transfer coefficient (a measure of the cooling ability of the system) may be increased by a factor of as much as ten over normal liquid cooling. The enhanced cooling ability provided by nucleate boiling could not occur in a cooling system relying on a solid moving part for heat transfer. High-velocity fluid flow inhibits the onset of film boiling and consequent "burn out" that can occur in low-velocity boiling-fluid systems (as mentioned above in connection with heat pipes). High-velocity water-cooling systems utilizing nucleate boiling have reliably transferred as much as several kilowatts of power per square centimeter of cooled area.

There have been many prior-art approaches to cooling heat-generating components using liquid cooling. In many common applications of liquid cooling, the heat generated by a device is transferred to a high-velocity liquid (typically flowing through the tiny channels of a heat sink in contact with the device). The liquid is conveyed (typically in another hose, pipe, or other conduit) to a small auto-radiator-like heat exchanger, and finally, the liquid is returned (typically via hose, pipe, or other conduit) to the pump and the heat-generating device so the process can repeat. In some cases, by allowing direct contact between the cooling fluid and the semiconductor package, the transfer of heat is enhanced. This results from the elimination of temperature differences between the heat sink and fluid and in the heat-sink compound used in the joint between the component and the heat sink. Here, the heat transferred again depends upon the mass flow rate of the liquid multiplied, in this case, by the specific heat of the liquid and the temperature change. For maximum heat transfer, the recirculating cooling liquid must be pumped, at high velocity, through small channels in the heat exchanger, and connecting pipes. Especially when operating at the high mass-flow rates required for maximum heat transfer, such systems may suffer from large pressure drops, or "head losses."

Another approach to using liquid cooling to cool heat generating components attempts to address the shortcomings of cooling systems using recirculating liquid cooling. In this alternate approach, the cooling components are more integrated: a cooling device housing is thermally connected to a heat generating component, a cooling liquid is contained in the housing and is circulated inside the housing by an impeller. Completely integrated cooling devices are more easily usable in high power density electronic devices such as computers. The application is simpler because the cooling device is essentially a single component that thermally contacts the heat generating electronic components (rather than using separate liquid conduits, pumps and heat exchangers that would be required for a recirculating liquid cooling system). Additionally, by integrating the cooling components, the pump energy required can be used directly to transport the cooling liquid at high velocity across the heated surface rather than to overcome the head losses that are encountered in a less integrated liquid cooling system.

But, prior art attempts to integrate cooling device components have been problematic. Since prior-art integrated cooling devices have thermally or electrically conductive impellers driven by externally-created electromagnetic fields, heat transfer must occur between the impeller and the cooling fluid with its relatively poor thermal conductivity. A more direct heat transfer mechanism could provide enhanced cooling. Further, the thermally and electrically conductive impeller of the prior art requires compromises in the housing of the cooling device. The prior art integrated cooling devices have a composite housing, including layers of metal and plastic, to allow external electromagnetic fields to pass through the surface of the housing and motivate the impeller. The composite structure may not be able to withstand the amounts of heat generated by ever increasing power densities of modern electronic components. This indirectly motivated impeller of the prior art may also revolve at a lower speed than the speed of the motivating electromagnetic field. Therefore, another drawback of the prior art is poor liquid circulation and possible difficulties in achieving a turbulent flow in the cooling liquid. Alternatively, the impeller of prior-art integrated cooling devices is motivated by a shaft that, in turn, is driven by an external motor. Such an external motor shaft drive arrangement requires a seal between the motor and the housing and impeller. As the seal begins to wear, leaking cooling liquid can lead to problems such as leakage, reduced cooling effectiveness and ultimately damage the heat-generating components or adjacent electronic components. Additionally, the prior-art attempts to provide an integrated liquid cooling mechanism have failed to take advantage of the additional cooling ability provided by nucleate boiling.

Therefore, in light of the prior art, there is a need for an integrated cooling device that has a direct, high thermal capacity, low-temperature-difference heat-transfer path, that circulates the cooling liquid in turbulent flow without requiring sealing between rotating components and the housing, and that can advantageously use nucleate boiling to cool the heat-generating components.

SUMMARY OF THE INVENTION

The present invention provides a method and apparatus for cooling electronic components using an integrated circulating liquid cooling device.

The integrated cooling device of the present invention comprises a housing, cooling liquid, a motor, an impeller, and cooling surfaces. It also allows for expansion of the cooling liquid as the temperature changes. Contained within the housing is the cooling liquid. Immersed in the cooling liquid is a motor driving an impeller. The surface of the housing is thermally connected to cooling surfaces such as cooling fins, a thermally conducting computer or other-electronic-equipment case, or a low-velocity fluid path carrying a second cooling fluid other than air.

The housing may have any shape, but if a close fitting impeller is desired, the shape of the interior surface of the housing can be generated by rotating about an axis, a line generatrix following any arbitrary path between any two points on that axis. For example, the shape of the housing would be a cylinder if the generatrix rotated about the axis were formed of three straight-line segments that form a rectangle with the axis as the fourth side. The generatrix of a hat shaped enclosure would have five joined straight-line segments between the points on the axis. A curved line-segment would generate a spherical or domed surface. Additionally, the line generatrix may include at least one feature that generates at least one ridge on the resulting interior surface of the housing. Such a feature yields increased surface area as compared with a non-ridged housing. The ridge may be oriented with its highest portion extending into the interior of the housing, or, it may be oriented with its highest portion extending into the wall of the housing (such that a groove is created in the wall of the housing) This increased surface area results in increased cooling capacity of the integrated cooling device. In one preferred embodiment in which high-velocity coolant flow would occur over the largest possible interior surface, the motor and impeller are concentric with and closely fit the housing. Alternatively, the impeller and motor could be located so they provide the highest velocity coolant liquid flow to only that area of the housing where the greatest heat transfer is needed (e.g., near the component to be cooled). Thus, a small motor could provide local high-velocity flow.

The housing may be completely filled or almost completely filled with a cooling liquid. If the housing is completely filled with liquid, a bellows, flexible diaphragm, or other flexible element must be provided in the housing to allow for thermal expansion of the cooling liquid. On the other hand, if a small volume filled with a compressible gas is provided within the housing, it will have no effect on the satisfactory operation of the cooling device. Any void in the cooling liquid will be forced into the center of the housing by centrifugal forces when the motor spins the liquid. In some cases, the compressible gas may be comprised only of the vapor phase of the cooling liquid.

The placement of the motor and impeller inside the housing and immersed in the cooling liquid provides several advantages. The motor's placement within the housing creates a more fully integrated cooling device than that of the prior art, which had an external motor. The level of integration afforded by the cooling device of the present invention is especially desirable given the ever-shrinking size constraints imposed by modern electronic components. Further, the motor's placement within the housing significantly reduces the potential for leakage and damage to the components to be cooled since, unlike the prior art, there is no need to seal the housing around a rotating impeller drive shaft. Also, since the impeller is directly driven, rather than motivated indirectly by external electromagnetic fields, the impeller need not be composed of an electrically conductive material. Unlike the prior art, heat transfer from the heat-generating component to the cooling surface will be more direct because the housing of the present invention need not be composed of a composite material to allow electromagnetic fields (used to motivate the impeller of prior-art integrated cooling devices) to pass through. Rather, since the cooling device of the present invention features an enclosed motor that directly drives an impeller, the housing material may be any material with the desired durability and thermal properties (including metals that would interfere with the indirect drive system of the prior art integrated device). It will also be obvious that the integrated cooling device can be further integrated with the semiconductor package thus eliminating the temperature differences in a joint filled with heat-sink compound.

In choosing the cooling liquid, one must make a satisfactory compromise between thermal properties such as thermal capacity, mechanical properties such as viscosity, and other properties that make the liquid compatible with the immersed brushless motor. These last properties include lubrication and corrosion protection. A number of hydrocarbons, synthetic oils, chlorinated hydrocarbons, or fluorocarbons have such properties. One also might consider alcohols, glycols and mixtures of these with water. Mixtures of oil and water with emulsifying agents might also be considered, particularly if some attention is given to the surface treatment of the motor parts.

Additionally, the cooling liquid could be chosen to gain enhanced heat transfer characteristics through nucleate boiling. To take advantage of nucleate boiling, the cooling liquid chosen should have a boiling temperature approximately equal to the operating temperature of the heat-generating component.

Motors capable of operating in a liquid immersed environment are known in the art. For example, any shaded-pole or poly-phase alternating-current motor can operate in a liquid. A direct-current brushless motor (a polyphase motor with a solid-state inverter or commutation circuit, quite similar to those that propel the small fans used to move air in computers) could be mounted in the housing immersed in the cooling liquid. Such a motor will work well when immersed in a variety of liquids. Electrical connections to the motor are made through hermetic seals. The small fan motor mentioned have their stationary pole pieces and coils inside the rotor, which may be a permanently magnetized cylinder with a central shaft rotating in a bearing in the center of the pole pieces. The magnetized rotor may be surrounded by magnetic shielding, such as a soft iron cylinder, to strengthen the fields inside the rotor and reduce those outside the rotor, which might interfere with electronic circuits. The impeller is attached to the rotor of the motor. The impeller is comprised of a plurality of fins or vanes that are approximately normal to the outside circumference of the rotor and the inside circumference of the housing in order to form a paddlewheel-like structure inside the housing. A small clearance exists between the edges of the vanes and at least part of the walls of the housing. Unlike the prior art integrated devices, the impeller vanes do not have to be either a good thermal or electrical conductor.

Cooling surfaces such as a group of fins or vanes, a thermally conductive computer case, a channel carrying a second low-velocity liquid coolant other than air, or any other thermally conductive and dissipative elements are thermally connected to the outer surface of the housing. When the integrated cooling device is operating, heat is transferred from the heat generating component to the thermally connected outside surface of the housing of the integrated cooling device. The heat is then conducted through the housing into the inner surface of the housing. Alternately the electronic device package may be made a part of the housing. The turbulent flow of cooling liquid motivated by the impeller then distributes the heat energy substantially evenly throughout the liquid and over the inside surfaces of the housing. This distribution may be aided by nucleate boiling and vapor condensation in the liquid. The heat energy is then conducted through the walls of the housing to the cooling surfaces thermally attached to the large outside surfaces of the housing. Finally, the heat energy is dissipated from the cooling surface to the atmosphere or other environment by free or forced convection that may be produced for example by a blower external to the integrated cooling apparatus. It will be obvious that heat from the outside surface of the enclosure or fins could just as well be carried away by low velocity liquid. A more complete understanding of the integrated cooling device will be afforded to those skilled in the art, as well as a realization of additional advantages and objects thereof, by a consideration of the following detailed description of the preferred embodiment. Reference will be made to the appended sheets of drawings, which will first be described briefly.

DETAILED DESCRIPTION OF THE PREFERRED EMBODIMENT

The present invention provides an apparatus for cooling an electronic component with an integrated cooling device that overcomes the limitations of the prior art. In the detailed description that follows, like numerals are used to denote like elements appearing in one or more of the figures.

Figure 1:
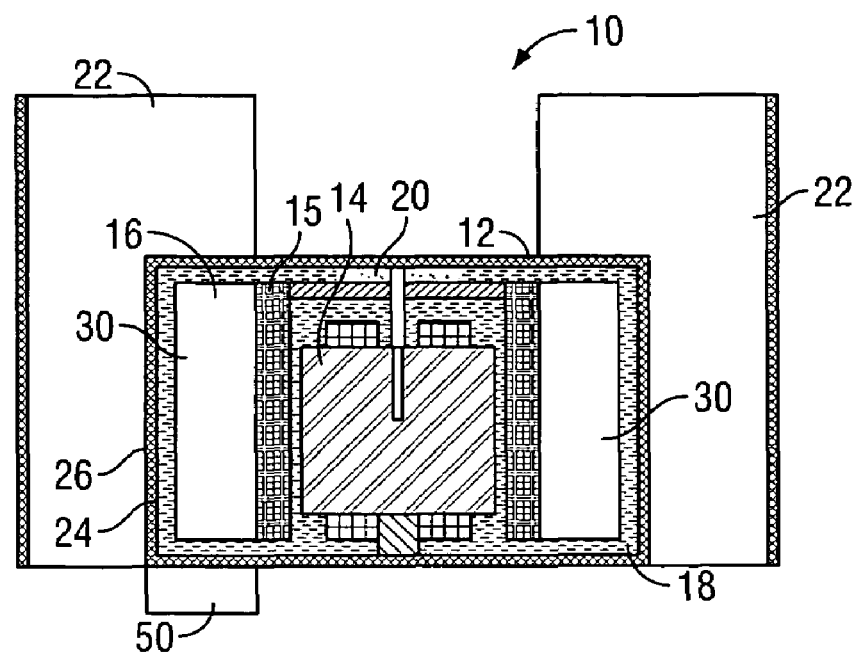
FIG. 1 is a cross-sectional side view diagram showing an exemplary integrated cooling device according to the invention.

Referring to FIG. 1, an embodiment of the integrated cooling device 10 of the present invention is depicted in a cross-sectional side view. The integrated cooling device 10 is comprised of a housing 12, a motor stator further comprising pole-pieces and windings 14, a cylindrical permanent magnet rotor 15, an impeller 16, cooling liquid 18, and cooling surfaces 22. The housing 12 of the integrated cooling device 10 has inside surfaces 24 and outside surfaces 26. FIG. 1 depicts the housing 12 as a right circular cylinder, although it should be appreciated that multiple geometries of housings are contemplated within the scope of the present invention. For example, hat-shaped, spherical, or dome-shaped geometries of the housing may be used to allow a close-fitting impeller. The housing 12 is sealed to prevent the cooling liquid 18 from escaping. The housing 12 and any electrical connections (not depicted) for the motor 14 may be hermetically sealed. The housing 12 is thermally connected to a heat generating component 50. The housing 12 may be comprised of a material with a relatively high thermal conductivity such as a metal. Optionally, the package of the heat-producing component could be integrated with the housing to further reduce temperature differences. Advantageously, a metal housing allows for effective transfer of heat from the heat generating component 50 to the integrated cooling device 10.

The motor stator 14 is mounted to the inside of the housing 12. In the depicted embodiment, the motor stator 14 is mounted concentrically with respect to the housing 12. This concentric mounting causes high-velocity coolant flow to occur over the largest possible interior surface of the housing 12. Alternatively, as described in connection with FIG. 3 below, the impeller and motor could be located so they provide the highest velocity coolant liquid flow to only that area of the housing where the greatest heat transfer is needed. This alternate embodiment could allow the use of a smaller motor and impeller than is required to generate high-velocity liquid flow across the largest possible interior surface of the housing 12.

The impeller 16 is affixed to and is rotated by the rotor 15 of the motor. The impeller 16 is comprised of a plurality of vanes 30 approximately normal to the outside circumference of the rotor 15 and, for the case of concentric mounting, the inside surface 24 of the housing 12 in order to form a paddlewheel-like structure inside the housing 12. The vanes 30 of the impeller 16 extend from the rotor 15 to a location sufficiently close to the inside surface 24 of the housing 12 to provide reasonably high-velocity coolant flow at the housing inner surface. Advantageously, this enclosed motor configuration allows for an integrated cooling device that does not need to be sealed around an external impeller drive shaft. Electrical connection to the motor may be made through hermetically sealed insulators (not shown).

In the depicted embodiment, the housing 12 is almost completely filled with a cooling liquid 18, with the remainder filled by a compressible gas 20. The compressible gas 20 allows the housing 12 and cooling liquid 18 to expand without distorting the housing 12 during operation of the integrated cooling device 10. In some cases the compressible gas may be comprised only of the vapor phase of the cooling liquid 18. Regardless of the orientation of the integrated cooling device 10 relative to gravitational forces, centrifugal forces generated by the rotating impeller 16 will force the compressible gas 20 into the center of the housing 12 during operation of the integrated cooling device 10. In alternate embodiments of the present invention, the housing 12 may be completely filled with a cooling liquid 18. In these alternate embodiments where the housing 12 is completely filled with cooling liquid, an expansion bellows, flexible diaphragm, or other flexible element must be provided in the housing to allow for thermal expansion of the cooling liquid.

The cooling liquid 18 could be chosen from a number of liquids based on their thermal properties and compatibility with the motor stator 14 and rotor 15. For enhanced cooling through nucleate boiling, the cooling liquid 18 should have a boiling temperature approximately equal to the operating temperature of the heat generating component 50. Advantageously, nucleate boiling increases the heat transfer coefficient of the liquid by a factor of up to approximately ten. A turbulent flow condition is created in the cooling liquid 18 through the rotation of the impeller 16.

Cooling surfaces 22 are thermally connected to the outside surfaces 26 of the housing 12. The cooling surfaces 22 may be an array of fins or vanes that allow heat transfer to the surrounding atmosphere via free or forced convection. Alternatively, the fins could be replaced by any other heat conductive and dissipative device such as a computer case for example. When the integrated cooling device 10 of the present invention is operated, heat energy is transferred from the heat generating source 50 through the housing 12 where it is distributed substantially evenly by the turbulent cooling liquid 18 throughout the inside surfaces 24 of the housing 12. The heat energy is then conducted through the housing 12 to the outside surfaces 26 of the housing 12 and dissipated from the cooling surfaces 22 by free or forced convection. Advantageously, the heat transfer pathway provided by the present invention efficiently transfers heat from a high-power-density small area device such as a semiconductor device or other electronic component to cooling surfaces 22 having a relatively large total surface area.

Figure 2:
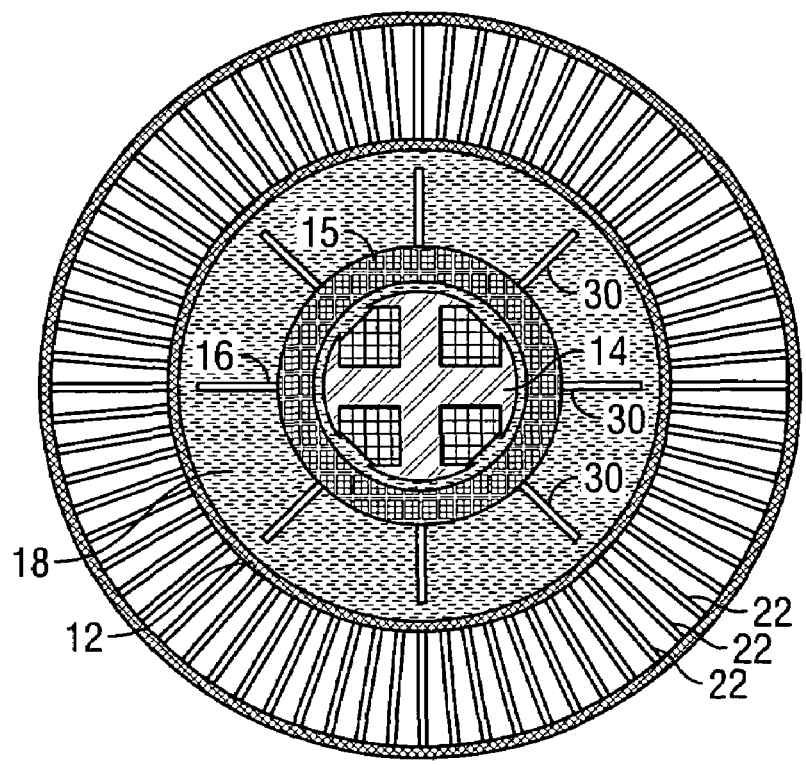
FIG. 2 is a top view diagram showing the integrated cooling device of FIG. 1.

FIG. 2 is a cross-sectional top view diagram showing the integrated cooling device of FIG. 1.

Figure 3:
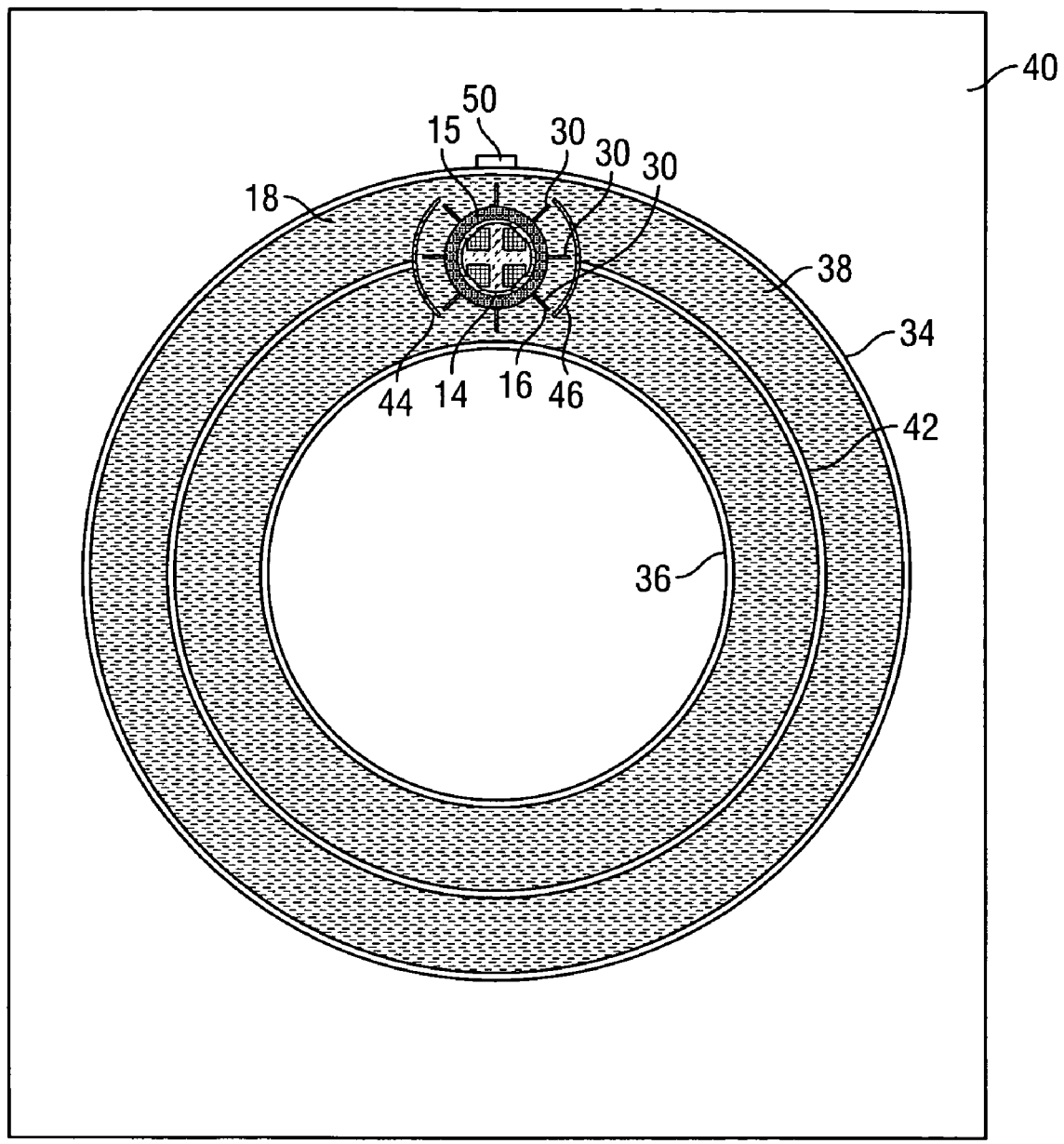
FIG. 3 is a cross-sectional top view of an alternative embodiment of the invention in which heat is transferred to the environment through the intermediary of an electronic computer case rather than fins.

FIG. 3 shows an exemplary arrangement of many of the components of the integrated cooling device shown in FIGS. 1 and 2. FIG. 3 shows a motor stator 14, permanent magnet rotor 15, and impeller vanes 30 essentially identical to those shown in FIGS. 1 and 2. The integrated cooling device of FIG. 3, however, is optimized to transfer heat from the heat generating component 50 to an electronic equipment or computer case surface 40, represented by a large rectangle. In thermal contact with the electronic equipment or computer case surface 40, is an enclosure 38 with a lower surface joining an outer cylindrical wall 34 and a concentric inner cylindrical wall 36. At their upper edges, the cylindrical walls 34 and 36 are joined by a surface, not shown, but having the same shape as the lower surface, and forming a closed toroidal enclosure with a rectangular cross section. The enclosure contains a cooling liquid 18, and may be hermetically sealed. It should be recognized that while the enclosure 38 is depicted here as a toroidal structure with a rectangular cross section, other geometries of enclosure may be employed within the scope of the present invention. The motor and impeller assembly, 14, 15, and, 16, fits within the enclosure 38, surfaces with small clearances between the impeller at top, bottom, and the side walls 34 and 36. A primary baffle 42 divides the enclosure into two channels that can carry cooling liquid 18 in opposite directions, clockwise and anticlockwise. Two secondary baffles, 44 and 46, join with the primary baffle 42, and the small openings between these secondary baffles 44 and 46 and the cylindrical walls, 34 and 36, insure that there will be high-velocity cooling liquid 18 flow adjacent to the heat-producing component, 50, and lower-velocity flows elsewhere around the toroidal enclosure 38. Unlike the situation in the embodiment of FIGS. 1 and 2, in which there was a fairly high power density at the roots of the fins 22, in this embodiment, the coolant spreads the heat over, more nearly, the entire surface area of the equipment case, 40. The heat-producing component is mounted on one of the surfaces of the toroidal enclosure 38 close to the impeller vanes 30 where the rate of heat transfer will be very high.

The integrated cooling device of the present invention may be used in a novel method of the present invention to cool an electronic component. In this method, the integrated cooling device, comprising a housing, cooling liquid contained in the housing, a motor mounted inside the housing, an impeller driven by the motor, and cooling surfaces thermally connected to the housing, is thermally connected to the electronic component to be cooled, and the motor of the integrated cooling apparatus is activated to drive the impeller. The additional step of selecting the cooling liquid such that the cooling liquid has a boiling point that is approximately equal to an operating temperature of the electronic component will enhance the cooling provided by this method.

Having thus described a preferred embodiment and an alternate embodiment of an integrated cooling device, it should be apparent to those skilled in the art that certain advantages of the described invention have been achieved. It should also be appreciated that various modifications, adaptations, and alternative embodiments thereof may be made within the scope and spirit of the present invention. For example, a cylindrical housing with a centrally mounted motor arranged to cool one electronic component has been illustrated. However, it should be apparent that the inventive concepts described above would be equally applicable to an embodiment in which multiple electronic components are thermally connected to the housing. Likewise, using a hat shaped enclosure which would provide more room for the motor or a dome shaped housing to better resist internal pressure might be a beneficial modification. Alternatively, a motor and impeller could be mounted close to a heat-producing device mounted, for example, on one side of a rectangular box, or multiple motor and impeller assemblies could be mounted within, and closely spaced to portions of a single enclosure of a more complex shape. Baffles of various shapes could also be used within the enclosure to advantageously direct the coolant fluid flow. Also, appropriate magnetic shielding, such as a soft iron cylinder around a magnetic motor rotor, as mentioned above, or soft iron parts in the housing, could be incorporated in the integrated cooling device to reduce any external magnetic fields produced by the device that might interfere with the proper operation of nearby electronic circuits. A housing of high electrical conductivity and sufficient thickness will also provide substantial attenuation of time varying magnetic fields by virtue of eddy currents or the "skin effect."

What is claimed is:

1. An apparatus for cooling at least one electronic component comprising:
    a housing thermally connected to the electronic component and having cooling surfaces;
    cooling liquid contained in the housing; and
    a motor mounted inside the housing and having an impeller operatively coupled to the motor, the impeller being adapted to being driven by the motor to circulate the cooling liquid within the housing to produce turbulent motion of the cooling liquid without producing substantial pressure differentials in the cooling liquid.

2. An apparatus for cooling at least one electronic component comprising:
    a housing thermally connected to the electronic component and having cooling surfaces;
    cooling liquid contained in the housing; and
    a motor mounted inside the housing and having an impeller operatively coupled to the motor, the impeller being adapted to being driven by the motor to circulate the cooling liquid within the housing;
    wherein the housing has an interior surface of a shape generated by rotating a line generatrix following an arbitrary path between any two points on an axis about that axis.

3. The apparatus of claim 2, wherein the interior surface of the housing is substantially cylindrical.

4. The apparatus of claim 2, wherein the interior surface of the housing is substantially hat-shaped.

5. The apparatus of claim 2, wherein the interior surface of the housing is substantially dome shaped.

6. The apparatus of claim 2, wherein the interior surface of the housing is substantially spherical.

7. The apparatus of claim 2, wherein the line generatrix comprises at least one feature such that the interior surface of the housing comprises at least one corresponding ridge.

8. The apparatus of claim 1, wherein the housing is hermetically sealed.

9. The apparatus of claim 1, wherein a package of the at least one heat-producing electronic component forms a part of the housing.

10. An apparatus for cooling at least one electronic component comprising:
- a housing thermally connected to the electronic component and having cooling surfaces;
- cooling liquid contained in the housing; and
- a motor mounted inside the housing and having an impeller operatively coupled to the motor, the impeller being adapted to being driven by the motor to circulate the cooling liquid within the housing;
- wherein the housing is comprised of a metallic material.

11. An apparatus for cooling at least one electronic component comprising:
- a housing thermally connected to the electronic component and having cooling surfaces;
- cooling liquid contained in the housing:
- a motor mounted inside the housing and having an impeller operatively coupled to the motor, the impeller being adapted to being driven by the motor to circulate the cooling liquid within the housing; and
- a volume of compressible gas contained in the housing such that expansion of the cooling liquid compresses the volume of compressible gas.

12. An apparatus for cooling at least one electronic component comprising:
- a housing thermally connected to the electronic component and having cooling surfaces;
- cooling liquid contained in the housing; and
- a motor mounted inside the housing and having an impeller operatively coupled to the motor, the impeller being adapted to being driven by the motor to circulate the cooling liquid within the housing;
- wherein the housing further comprises a cooling liquid expansion device and wherein the cooling liquid substantially fills the housing.

13. The apparatus of claim 12, wherein the cooling liquid expansion device comprises an expansion bellows.

14. The apparatus of claim 12, wherein the cooling liquid expansion device comprises a flexible diaphragm.

15. An apparatus for cooling at least one electronic component comprising:
- a housing thermally connected to the electronic component and having cooling surfaces;
- cooling liquid contained in the housing; and
- a motor mounted inside the housing and having an impeller operatively coupled to the motor, the impeller being adapted to being driven by the motor to circulate the cooling liquid within the housing;
- wherein the cooling liquid has a boiling point that is approximately equal to an operating temperature of the electronic component.

16. An apparatus for cooling at least one electronic component comprising:
- a housing thermally connected to the electronic component and having cooling surfaces;
- cooling liquid contained in the housing; and
- a motor mounted inside the housing and having an impeller operatively coupled to the motor, the impeller being adapted to being driven by the motor to circulate the cooling liquid within the housing;
- wherein the motor and impeller are mounted concentrically with respect to the housing.

17. An apparatus for cooling at least one electronic component comprising:
- a housing thermally connected to the electronic component and having cooling surfaces;
- cooling liquid contained in the housing; and
- a motor mounted inside the housing and having an impeller operatively coupled to the motor, the impeller being adapted to being driven by the motor to circulate the cooling liquid within the housing;
- wherein the motor is mounted near an area of relatively high heat generation in the housing.

18. The apparatus of claim 17, wherein at least one baffle inside the housing controls the direction of cooling liquid flow.

19. An apparatus for cooling at least one electronic component comprising:
- a housing thermally connected to the electronic component and having cooling surfaces;
- cooling liquid contained in the housing; and
- a motor mounted inside the housing and having an impeller operatively coupled to the motor, the impeller being adapted to being driven by the motor to circulate the cooling liquid within the housing;
- wherein the motor is a direct-current brushless motor.

20. An apparatus for cooling at least one electronic component comprising:
- a housing thermally connected to the electronic component and having cooling surfaces;
- cooling liquid contained in the housing; and
- a motor mounted inside the housing and having an impeller operatively coupled to the motor, the impeller being adapted to being driven by the motor to circulate the cooling liquid within the housing;
- wherein the impeller further comprises a plurality of vanes approximately normal to an inside circumference of the housing.

21. An apparatus for cooling at least one electronic component comprising:
- a housing thermally connected to the electronic component and having cooling surfaces;
- cooling liquid contained in the housing; and
- a motor mounted inside the housing and having an impeller operatively coupled to the motor, the impeller being adapted to being driven by the motor to circulate the cooling liquid within the housing;
- wherein the cooling surfaces comprise a plurality of air-cooled fins.

22. An apparatus for cooling at least one electronic component comprising:
- a housing thermally connected to the electronic component and having cooling surfaces;
- cooling liquid contained in the housing; and
- a motor mounted inside the housing and having an impeller operatively coupled to the motor, the impeller being adapted to being driven by the motor to circulate the cooling liquid within the housing;
- wherein the cooling surfaces comprise a thermally conductive and dissipative electronic equipment case.

23. An apparatus for cooling at least one electronic component comprising:
- a housing thermally connected to the electronic component and having cooling surfaces;
- cooling liquid contained in the housing;
- a motor mounted inside the housing and having an impeller operatively coupled to the motor, the impeller being adapted to being driven by the motor to circulate the cooling liquid within the housing; and
- a cooling fluid other than air, wherein the cooling fluid other than air is located outside the housing to cool the cooling surfaces.

24. An apparatus for cooling at least one electronic component comprising:

a housing thermally connected to the electronic component and having cooling surfaces;

cooling liquid contained in the housing;

a motor mounted inside the housing and having an impeller operatively coupled to the motor, the impeller being adapted to being driven by the motor to circulate the cooling liquid within the housing; and a magnetic shielding layer, wherein the magnetic shielding layer is configured to surround the motor to reduce an external magnetic field generated by an operation of the motor.

25. A method of cooling an electronic component comprising the steps of:

thermally connecting the electronic component to an apparatus comprising:
a housing containing a cooling liquid;
a motor mounted inside the housing;
an impeller driven by the motor; and
cooling surfaces thermally connected to the housing; and activating the motor of the apparatus to drive the impeller such that the cooling liquid is circulated within the housing to produce turbulent motion of the cooling liquid without producing substantial pressure differentials in the cooling liquid.

26. A method of cooling an electronic component comprising the steps of:

thermally connecting the electronic component to an apparatus comprising:
a housing containing a cooling liquid;
a motor mounted inside the housing;
an impeller driven by the motor; and
cooling surfaces thermally connected to the housing;

activating the motor of the apparatus to drive the impeller such that the cooling liquid is circulated within the housing; and selecting the cooling liquid to have a boiling point that is approximately equal to an operating temperature of the electronic component.

* * * * *